United States Patent
Endo et al.

(10) Patent No.: US 9,276,100 B2
(45) Date of Patent: Mar. 1, 2016

(54) SEMICONDUCTOR DEVICE HAVING A GATE RECESS STRUCTURE

(75) Inventors: Hiroshi Endo, Kawasaki (JP); Toshihiro Ohki, Kawasaki (JP); Toshihide Kikkawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 325 days.

(21) Appl. No.: 13/294,740

(22) Filed: Nov. 11, 2011

(65) Prior Publication Data

US 2012/0146097 A1    Jun. 14, 2012

(30) Foreign Application Priority Data

Dec. 10, 2010 (JP) ................. 2010-276379

(51) Int. Cl.
| | | |
|---|---|---|
| *H01L 29/78* | (2006.01) | |
| *H01L 29/778* | (2006.01) | |
| *H01L 29/423* | (2006.01) | |
| *H01L 29/66* | (2006.01) | |
| *H01L 29/20* | (2006.01) | |

(52) U.S. Cl.
CPC ........ *H01L 29/7787* (2013.01); *H01L 29/4236* (2013.01); *H01L 29/42356* (2013.01); *H01L 29/42364* (2013.01); *H01L 29/66462* (2013.01); *H01L 29/7839* (2013.01); *H01L 29/2003* (2013.01)

(58) Field of Classification Search
CPC combination set(s) only.
See application file for complete search history.

(56) References Cited

U.S. PATENT DOCUMENTS

| | | |
|---|---|---|
| 2005/0230734 A1 | 10/2005 | Ha et al. |
| 2006/0110884 A1 | 5/2006 | Wang et al. |
| 2008/0283844 A1 | 11/2008 | Hoshi et al. |
| 2009/0050937 A1 | 2/2009 | Murata et al. |
| 2010/0006894 A1* | 1/2010 | Ohta et al. ............ 257/192 |
| 2010/0167478 A1 | 7/2010 | Nakazawa et al. |
| 2011/0057257 A1* | 3/2011 | Park et al. ............ 257/330 |
| 2011/0089468 A1* | 4/2011 | Zhang ............ 257/194 |
| 2011/0147798 A1* | 6/2011 | Radosavljevic et al. ...... 257/194 |
| 2012/0061727 A1* | 3/2012 | Lee et al. ............ 257/183 |

FOREIGN PATENT DOCUMENTS

| | | |
|---|---|---|
| JP | 2002-359256 | 12/2002 |
| JP | 2005-311317 | 11/2005 |

(Continued)

OTHER PUBLICATIONS

Taiwanese Office Action issued Mar. 7, 2014 for corresponding Taiwanese Patent Application No. 100140907, with Partial Translation, 15 pages.

(Continued)

*Primary Examiner* — Daniel Luke
(74) *Attorney, Agent, or Firm* — Fujitsu Patent Center

(57) ABSTRACT

A semiconductor device includes a first semiconductor layer disposed over a substrate, a second semiconductor layer disposed over the first semiconductor layer, a gate recess disposed, through removal of a part of or all the second semiconductor layer, in a predetermined region over the first semiconductor layer, an insulating film disposed over the gate recess and the second semiconductor layer, a gate electrode disposed over the gate recess with the insulating film therebetween, and a source electrode and a drain electrode disposed over the first semiconductor layer or the second semiconductor layer, whereby a central portion of the gate recess is higher than a peripheral portion of the gate recess.

11 Claims, 21 Drawing Sheets

(56) References Cited

FOREIGN PATENT DOCUMENTS

| | | | | |
|---|---|---|---|---|
| JP | 2007-088458 | | 4/2007 | |
| KR | 10-2006/0026262 | * | 3/2006 | |
| KR | 1020060026262 | | 3/2006 | |
| WO | WO 2009149626 A1 | * | 12/2009 | ............ H01L 29/778 |

OTHER PUBLICATIONS

First Office Action of Chinese Patent Application No. 201110408970.1 dated Jan. 3, 2014, with English Translation of the Office Action.

JPOA—Office Action of Japanese Patent Application No. 2010-276379 dated Sep. 16, 2014 with Partial Translation.

* cited by examiner

SEMICONDUCTOR DEVICE HAVING A GATE RECESS STRUCTURE

CROSS-REFERENCE TO RELATED APPLICATIONS

This application is based upon and claims the benefit of priority from the prior Japanese Patent Application No. 2010-276379 filed on Dec. 10, 2010, the entire contents of which are incorporated herein by reference.

FIELD

The present invention relates to a semiconductor device and a method for manufacturing a semiconductor device.

BACKGROUND

A material formed from GaN, AlN, or InN, which is a nitride semiconductor, or a mixed crystal thereof or the like has a wide band gap and has been used as a high output electronic device, a short wavelength light-emitting device, or the like. Among them, as for the high output electronic device, a technology related to a field effect transistor (FET), in particular a high electron mobility transistor (HEMT), has been developed. The above-described HEMT by using the nitride semiconductor is used for high-output high-efficiency amplifiers, high-power switching devices, and the like.

HEMT used for such purposes is required to be normally off, have a high dielectric strength, and the like. In particular, normally off is important from the viewpoint of safe operation. Therefore, various methods for ensuring normally off have been studied. As for one of the methods for ensuring normally off, a method in which a gate recess is formed by removing a part of a semiconductor layer immediately below a gate electrode is mentioned. The gate recess structure formed by this method has advantages that, for example, a threshold voltage may be made positive without increasing a resistance component between electrodes. Meanwhile, a semiconductor device of normally off, which is used for electric power applications, is required to have a high drain breakdown voltage and a high gate breakdown voltage. Therefore, regarding horizontal structure FET and HEMT, a metal insulator semiconductor (MIS) structure, in which an insulating film serving as a gate insulating film is formed, has been used. As described above, regarding HEMT by using a GaN based semiconductor material, a semiconductor device suitable for the electric power applications may be produced by employing a structure, in which the gate recess structure and the MIS structure are combined.

Japanese Patent Laid-Open No. 2002-359256 is noted here as related literature.

SUMMARY

According to aspects of embodiments, a semiconductor device includes a first semiconductor layer disposed over a substrate, a second semiconductor layer disposed over the first semiconductor layer, a gate recess disposed, through removal of a part of or all the second semiconductor layer, in a predetermined region over the first semiconductor layer, an insulating film disposed over the gate recess and the second semiconductor layer, a gate electrode disposed over the gate recess with the insulating film therebetween, and a source electrode and a drain electrode disposed over the first semiconductor layer or the second semiconductor layer, whereby a central portion of the gate recess is higher than the peripheral portion of the gate recess.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is an explanatory diagram of HEMT formed from GaN or the like;

DESCRIPTION OF EMBODIMENTS

Various embodiments will be explained with reference to accompanying drawings.

Figure 1:
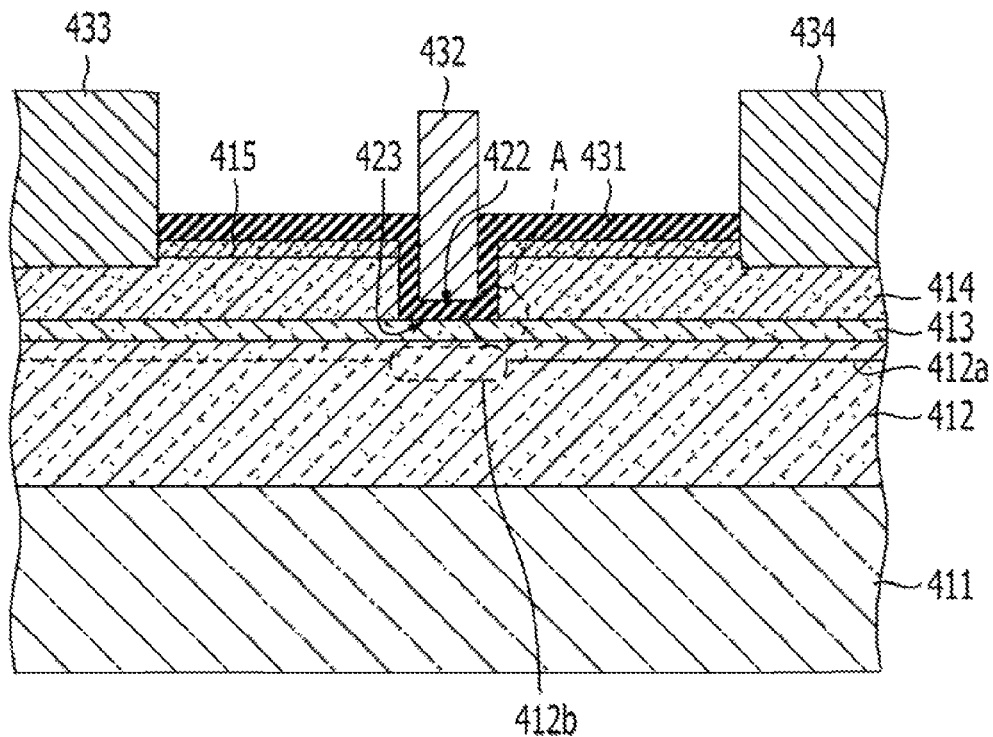

As depicted in FIG. 1 in a related art, HEMT having the above-described gate recess structure is formed in such a way that the bottom of the gate recess takes on a flat shape.

That is, in a semiconductor device 410 formed from this HEMT having the gate recess structure, an i-GaN electron transit layer 412, an i-AlGaN spacer layer 413, an n-AlGaN electron supply layer 414, and an n-GaN cap layer 415 are disposed on a substrate 411 formed from semi-insulating SiC or the like. Consequently, a two-dimensional electron gas (2DEG) 412a is formed in the i-GaN electron transit layer 412 in the vicinity of the interface between the i-GaN electron transit layer 412 and the i-AlGaN spacer layer 413. A gate recess 422 is disposed in the n-GaN cap layer 415 and the n-AlGaN electron supply layer 414. An insulating film 431 serving as a gate insulating film is disposed on the bottom and the side surface of the gate recess 422 and the n-GaN cap layer 415. Furthermore, a gate electrode 432 is disposed on the region provided with the gate recess 422 with the insulating film 431 therebetween. A source electrode 433 and a drain electrode 434 are disposed on the n-AlGaN electron supply layer 414.

The bottom of the gate recess 422 is formed by common dry etching or the like and is nearly flat. However, if the bottom 423 of the gate recess is formed to become nearly flat, a region 412b, which is indicated by a broken line and in which electrons are hardly present, is formed in the 2DEG 412a. In this case, if a high voltage is applied between the drain and the source, in a region A indicated by a broken line, an electric field is concentrated on the insulating film 431, the i-AlGaN spacer layer 413, and the like at the end portion of the gate electrode 432 in the drain electrode 434 side. Consequently, dielectric breakdown and the like occurs in the insulating film 431 and the semiconductor layer, e.g., the i-AlGaN spacer layer 413, the semiconductor device is broken, and the reliability is degraded.

Accordingly, a highly reliable semiconductor device in which dielectric breakdown and the like do not occur easily in an insulating film serving as a gate insulating film and an semiconductor layer and a method for manufacturing the semiconductor device is provided.

A semiconductor device according to the present embodiment will be described with reference to FIG. 2. The semiconductor device 10 according to the present embodiment includes an electron transit layer 12, a spacer layer 13, an electron supply layer 14, and a cap layer 15, which are formed by epitaxial growth, on a substrate 11 formed from semi-insulating film SiC or the like. In this regard, the electron transit layer 12 serving as a first semiconductor layer is formed from i-GaN, and the spacer layer 13 serving as a fourth semiconductor layer is formed from i-AlGaN. Meanwhile, the electron supply layer 14 serving as a second semiconductor layer is formed from n-AlGaN, and the cap layer 15 serving as a third semiconductor layer is formed from n-GaN. Consequently, a two-dimensional electron gas (2DEG) 12a is formed in the electron transit layer 12 formed from i-GaN in the vicinity of the interface between the electron transit layer 12 formed from i-GaN and the spacer layer 13 formed from i-AlGaN.

The gate recess 22 is formed by etching a part of the cap layer 15, the electron supply layer 14, and the spacer layer 13, and the bottom 23 of the gate recess 22 is formed into a convex shape by shaping the spacer layer 13. That is, the bottom 23 of the gate recess 22 is formed in such a way that in the spacer layer 13 serving as the fourth semiconductor layer, the central portion 23a of the recess 22 is higher than the peripheral portion 23b of the recess 22. The method for forming the bottom 23 of the gate recess 22 into the convex shape, as described above, will be described later. Moreover, an insulating film 31 serving as a gate insulating film is disposed on the bottom 23 and the side surface of the gate recess 22 and the cap layer 15. A gate electrode 32 is disposed on the region provided with the gate recess 22 with the insulating film 31 therebetween. Furthermore, a source electrode 33 and a drain electrode 34 are disposed on the electron supply layer 14. In this regard, the source electrode 33 and the drain electrode 34 may be disposed on the electron transit layer 12 or the like.

Figure 3:
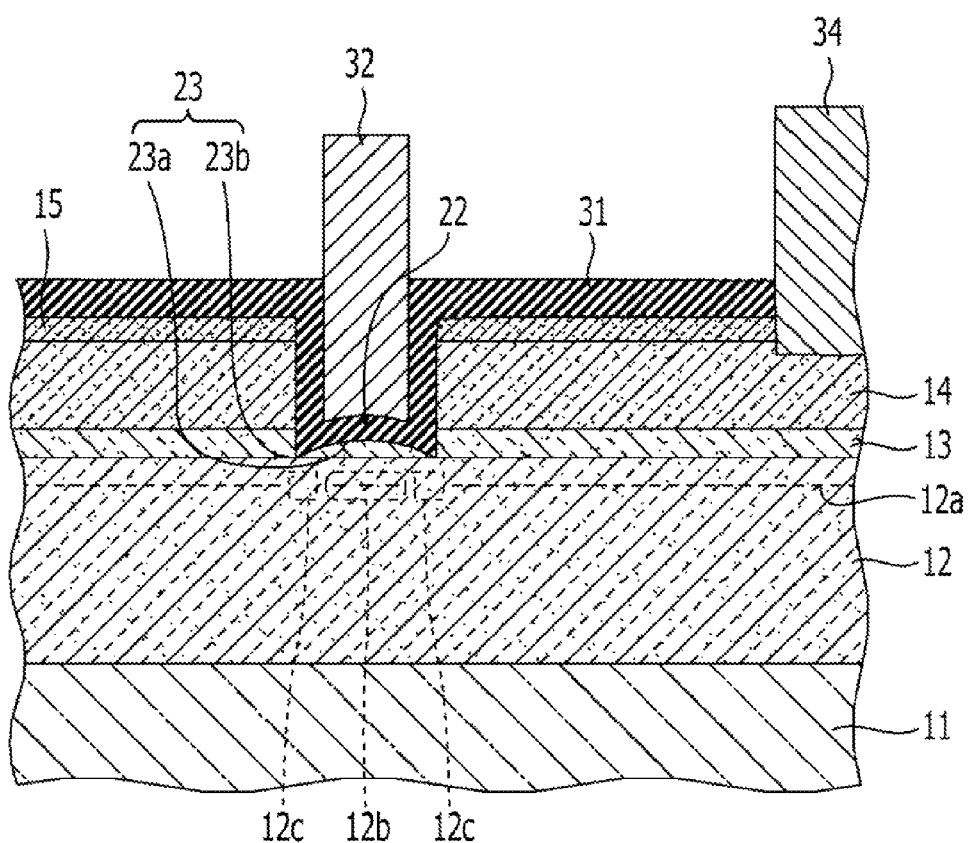
FIG. 3 is an explanatory diagram of the semiconductor device according to the first embodiment.

In the present embodiment, as shown in FIG. 3, the bottom 23 of the gate recess 22 is formed into the shape in which the central portion 23a is higher than the peripheral portion 23b. That is, the bottom 23 of the gate recess 22 is formed in such a way that the peripheral portion 23b becomes deeper than the central portion 23a. Consequently, the electron density of a region 12b, which corresponds to the central portion 23a of the bottom 23 of the gate recess 22 and which is indicated by a broken line, may be made higher than the electron densities of a region 12c, which corresponds to the peripheral portion 23b of the bottom 23 of the gate recess 22 and which is indicated by a broken line, and the 2DEG 12a.

In the case where such a structure is employed, concentration of an electric field on the end portion of the gate electrode 32 in the drain electrode 34 side is relaxed and dielectric breakdown and the like may be prevented or reduced. That is, electrons of two-dimensional electron gas in the region 12b, which is the central portion immediately below the gate electrode 32, may be increased, concentration of an electric field immediately below the gate electrode 32 is relaxed, and breakage in the insulating film 31 and the semiconductor layer may be prevented or reduced, so that the reliability may be improved.

Figure 4:
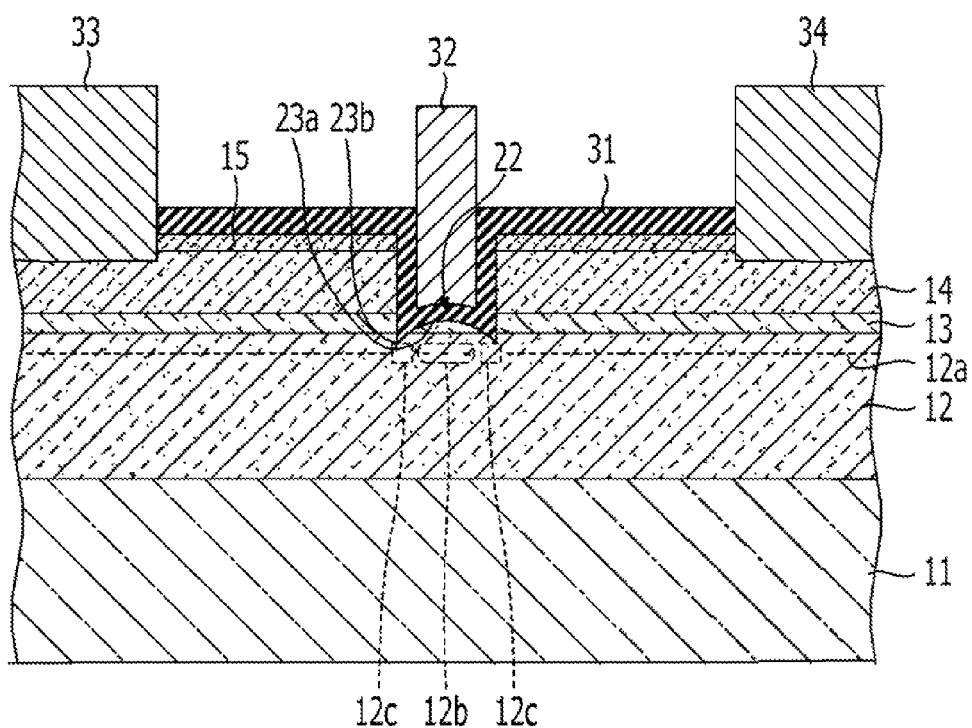
FIG. 4 is a structural diagram of another semiconductor device according to the first embodiment.

In this regard, in the present embodiment, besides the above-described structure, as shown in FIG. 4, the bottom 23 of the gate recess 22 may be formed in such a way that the spacer layer 13 serving as the fourth semiconductor layer is exposed at the central portion 23a, and the electron transit layer 12 serving as the first semiconductor layer is exposed at the peripheral portion 23b. In the case where such a structure is employed as well, the electron density of the region 12b corresponding to the central portion 23a of the bottom 23 of the gate recess 22 may be made higher than the electron densities of the region 12c corresponding to the peripheral portion 23b of the bottom 23 of the gate recess 22 and the 2DEG 12a.

Figure 5:
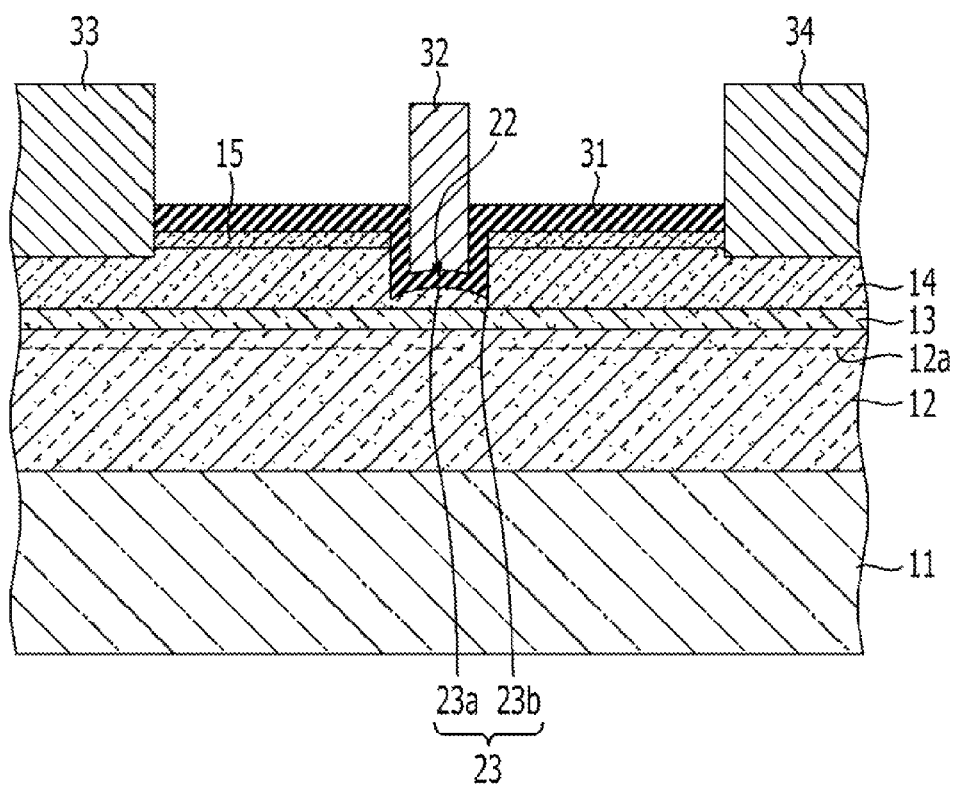
FIG. 5 is a structural diagram of another semiconductor device according to the first embodiment.

Alternatively, as shown in FIG. 5, the bottom 23 of the gate recess 22 may be formed locating at the electron supply layer 14 serving as the second semiconductor layer in such a way that the central portion 23a of the bottom 23 of the gate recess 22 is higher than the peripheral portion 23b. In the case where such a structure is employed as well, the electron density of the region 12b corresponding to the central portion 23a of the bottom 23 of the gate recess 22 may be made higher than the electron densities of the region 12c corresponding to the peripheral portion 23b of the bottom 23 of the gate recess 22 and the 2DEG 12a.

In this regard, the electron supply layer 14 serving as the second semiconductor layer may be formed from i-InAlN, n-InAlN, or the like besides the above-described n-AlGaN.

Next, the method for manufacturing a semiconductor device according to the present embodiment will be described with reference to FIG. 6A to FIG. 6J.

Figure 6A:
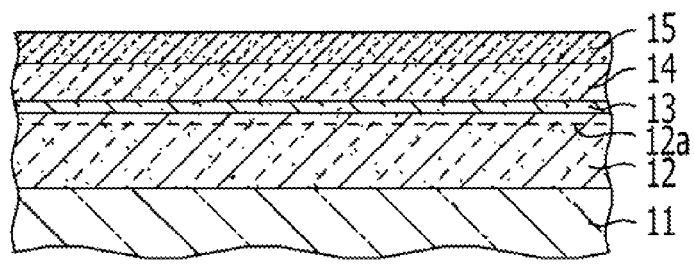
FIGS. 6A to 6J are diagrams of a method for manufacturing the semiconductor device according to the first embodiment.

Initially, as shown in FIG. 6A, the electron transit layer 12, the spacer layer 13, the electron supply layer 14, and the cap layer 15 are formed sequentially on the substrate 11 formed from semi-insulating SiC or the like by epitaxial growth by MOVPE, so as to form the semiconductor layer. As for the substrate 11, sapphire, GaN, and the like may be used besides SiC. The electron transit layer 12 serving as the first semiconductor layer is formed from i-GaN in such a way that the thickness becomes about 3 µm. The spacer layer 13 serving as the fourth semiconductor layer is formed from i-$Al_{15}Ga_{85}N$ in such a way that the thickness becomes about several nanometers. The electron supply layer 14 serving as the second semiconductor layer is formed from n-$Al_{30}Ga_{70}N$ in such a way that the thickness becomes about 30 nm and is doped with $5×10^{18}$ $cm^{-3}$ of Si as an impurity element. The cap layer 15 serving as the third semiconductor layer is formed from n-GaN in such a way that the thickness becomes about 10 nm and is doped with $5×10^{18}$ $cm^{-3}$ of Si as an impurity element. Consequently, the 2DEG 12a is formed in the electron transit layer 12 in the vicinity of the interface between the electron transit layer 12 and the spacer layer 13. Regarding the semiconductor device and the like having the structure shown in FIG. 4, it is preferable that the composition ratio of Al in the spacer layer 13 serving as the fourth semiconductor layer is a value lower than the composition ratio of Al in the electron supply layer 14 serving as the second semiconductor layer.

This is because regarding dry etching, e.g., RIE, by using a gas that includes a chlorine component, the etching rate becomes large, as the composition ratio of Al becomes small and, therefore, the bottom 23 of the gate recess 22 is formed into a convex shape easily. Thereafter, an element isolation region is formed, although not shown in the drawing. Specifically, a photoresist to form the element isolation region is applied, and exposure with an exposing apparatus and development are performed, so that a resist pattern having an opening portion in the region to be provided with the element isolation region is formed. Subsequently, dry etching by using a gas that includes a chlorine component is performed, and an insulating film is formed or ion implantation of a predetermined ion is performed in the region subjected to the dry etching, so that the element isolation region is formed.

Figure 6B:
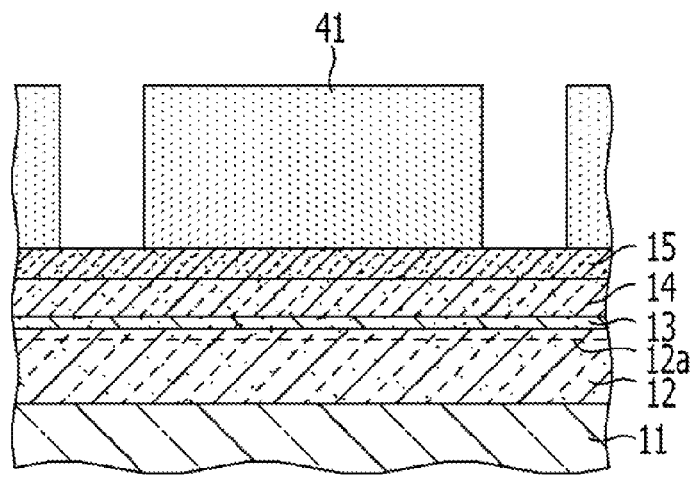

Then, as shown in FIG. 6B, a resist pattern 41 is formed. Specifically, a photoresist is applied to the surface of the cap layer 15, and exposure with an exposing apparatus and development are performed, so that a resist pattern 41 having opening portions in the regions to be provided with the source electrode 33 and the drain electrode 34 is formed.

Figure 6C:
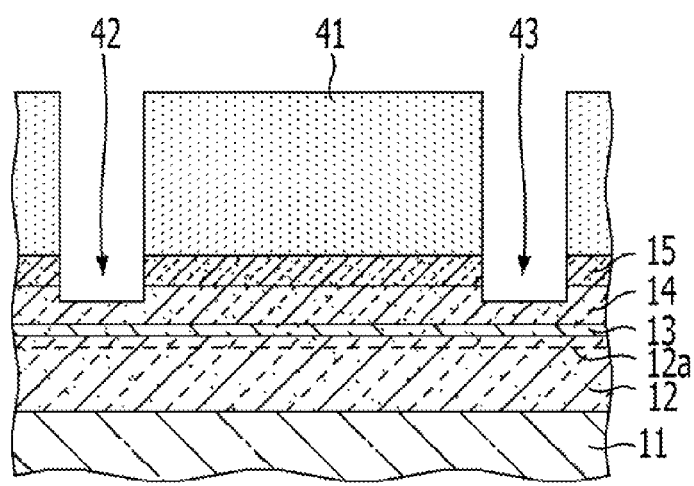

As shown in FIG. 6C, a part of the cap layer 15 and the electron supply layer 14 in the region not provided with the resist pattern 41 are removed by dry etching, e.g., RIE, so as to form opening regions 42 and 43. This dry etching, e.g., RIE, is performed by introducing a gas, which includes a chlorine component, as an etching gas into a chamber.

Figure 6D:
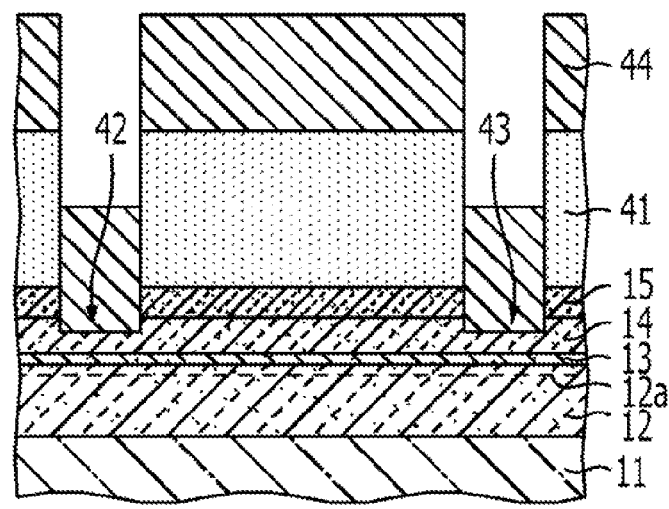

As shown in FIG. 6D, a Ta film having a thickness of about 20 nm and an Al film having a thickness of about 200 nm are formed sequentially through vacuum evaporation, so that a metal film 44 is formed.

Figure 6E:
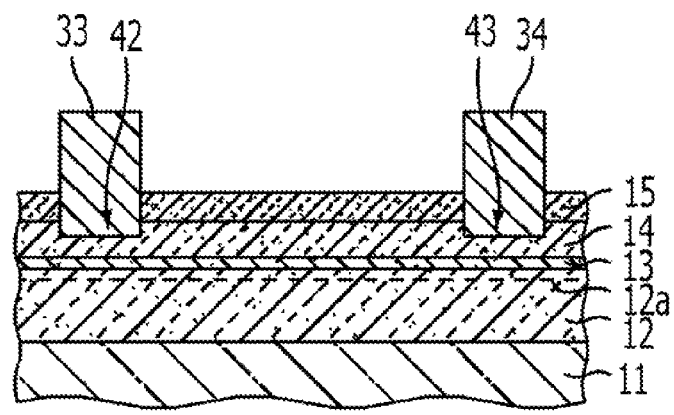

As shown in FIG. 6E, lift-off is performed by using an organic solvent or the like and, thereby, the metal film 44 formed on the resist pattern 41 is removed together with the resist pattern 41. Consequently, the source electrode 33 and the drain electrode 34 are formed by the metal film 44 formed in the regions not provided with the resist pattern 41, that is, opening regions 42 and 43. Thereafter, the source electrode 33 and the drain electrode 34 are brought into ohmic contact by performing a heat treatment at a temperature of 400° C. to 1,000° C., for example, 550° C.

Figure 6F:
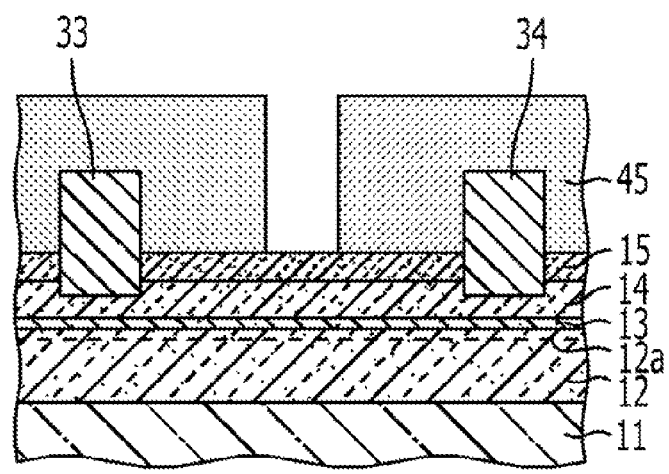

As shown in FIG. 6F, a resist pattern 45 is formed on the surfaces of the source electrode 33, the drain electrode 34, and the cap layer 15. The resist pattern 45 is formed by applying a photoresist to the surfaces of the cap layer 15 and the like and performing exposure with an exposing apparatus and development. In this manner, the resist pattern 45 having an opening portion in the region to be provided with the gate recess 22, as described later, is formed.

Figure 6G:
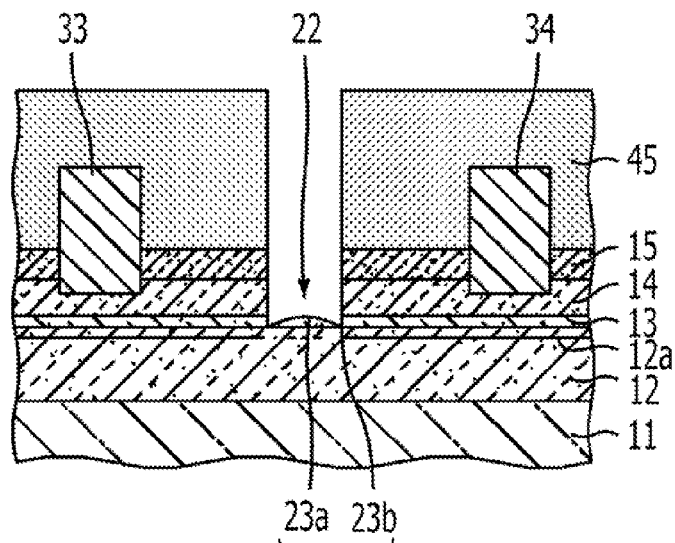

As shown in FIG. 6G, dry etching, e.g., RIE, is performed and, thereby, a part of or all the cap layer 15, the electron supply layer 14, and the spacer layer 13 in the region not provided with the resist pattern 45 are removed, so as to form the gate recess 22. As for the etching gas used for this dry etching, e.g., RIE, a chlorine based gas (gas that includes a chlorine component) is employed. In the present embodiment, 30 scan of $Cl_2$ serving as an etching gas is introduced into an etching chamber, the pressure in the etching chamber is specified to be 2 Pa, 20 W of radio frequency (RF) power is applied and, thereby, RIE is performed, so as to form the gate recess 22. Consequently, as shown in FIG. 2, the bottom 23 of the gate recess 22 may be formed into a convex shape. That is, the bottom 23 may be formed into the shape in which the central portion 23a is higher than the peripheral portion 23b. In order to form the bottom 23 of the gate recess 22 into a convex shape, as described above, a condition in which the substrate temperature is relatively low, specifically a condition in which the substrate temperature is specified to be ambient or room temperature or lower by, for example, cooling the substrate, and a condition in which the applied bias is relatively high are preferable. The condition in which the applied bias is high refers to, for example, the condition in which the applied RF power is high because a high RF power causes a high self bias.

Figure 6H:
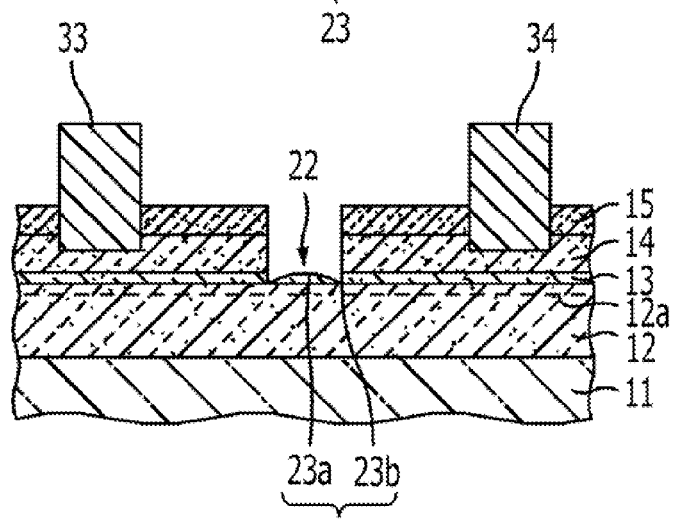

As shown in FIG. 6H, the resist pattern 45 is removed by an organic solvent or the like. Consequently, the resist pattern 45 is removed and, thereby, the gate recess 22 is formed.

Figure 6I:
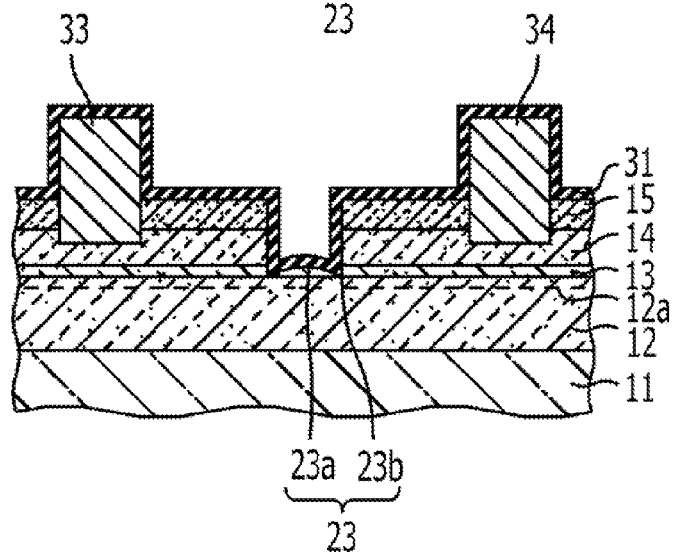

As shown in FIG. 6I, the insulating film 31 is formed on the surface of the cap layer 15 and the gate recess 22. In the present embodiment, as for the insulating film 31, an aluminum oxide ($Al_2O_3$) film having a thickness of 2 nm to 200 nm is formed. Specifically, an aluminum oxide film having a thickness of about 10 nm is formed and, thereby, the insulating film 31 is formed. Examples of methods for forming the insulating film 31 include chemical vapor deposition (CVD), atomic layer deposition (ALD), and sputtering. In this regard, the insulating film 31 may be formed from an oxide, a nitride, an oxynitride, or the like of Si, Al, Hf, Zr, Ti, Ta, W, or the like besides the above-described aluminum oxide.

Figure 6J:
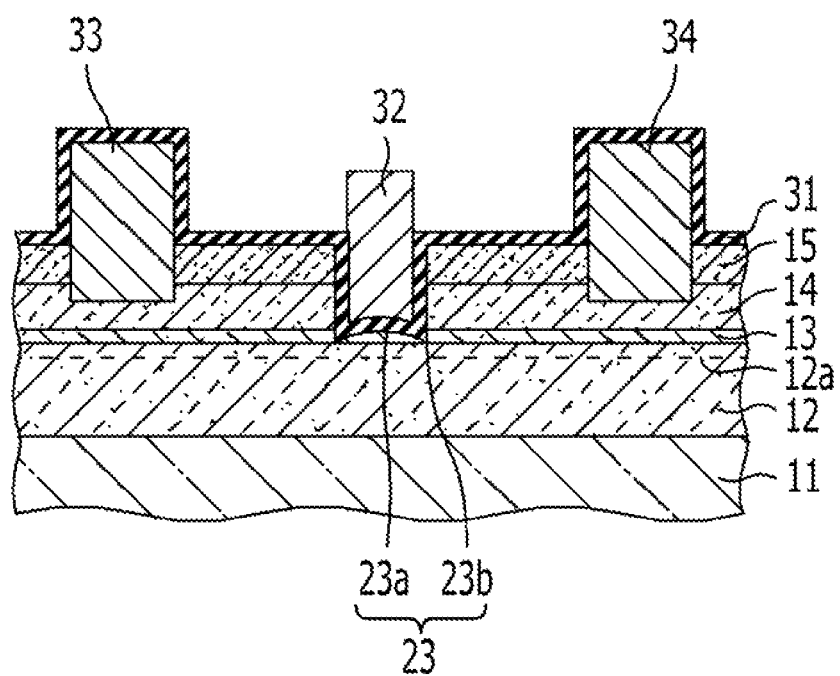

As shown in FIG. 6J, the gate electrode 32 is formed on the region provided with the gate recess 22 with the insulating film 31 therebetween. Specifically, a photoresist is applied to the insulating film 31, and exposure with an exposing apparatus and development are performed, so that a resist pattern, although not shown in the drawing, having an opening portion in the region to be provided with the gate electrode 32 is formed. Thereafter, a Ni film having a thickness of about 30 nm and a Au film having a thickness of about 400 nm are formed sequentially through vacuum evaporation, so that a metal film is formed. Subsequently, lift-off is performed by using an organic solvent or the like and, thereby, the metal film disposed on the resist pattern is removed together with the resist pattern. Consequently, the gate electrode 32 is formed by the metal film formed in the region not provided with the resist pattern.

In this manner, a semiconductor device may be produced on the basis of the method for manufacturing a semiconductor device according to the present embodiment.

Regarding the semiconductor device produced on the basis of the method for manufacturing a semiconductor device according to the present embodiment, the bottom 23 of the gate recess 22 is formed into a convex shape, so that the breakdown voltage is high, dielectric breakdown and the like may be prevented or reduced, and the reliability is high.

Figure 2:
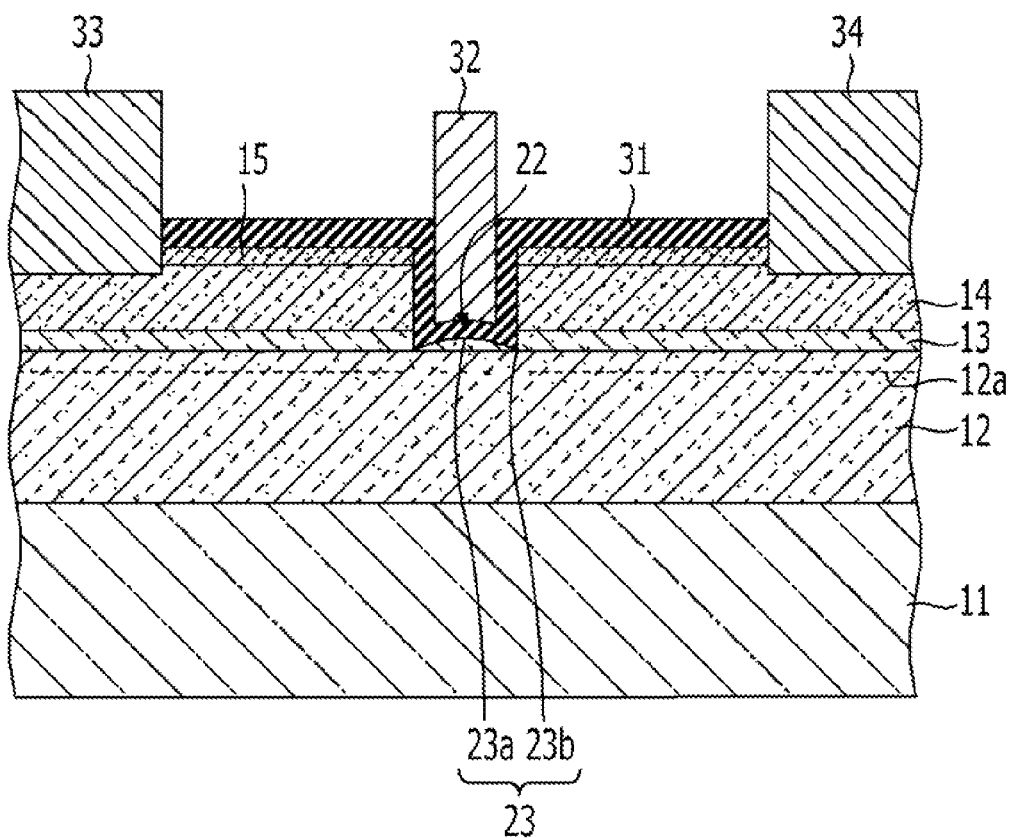
FIG. 2 is a structural diagram of a semiconductor device according to a first embodiment.
Figure 7:
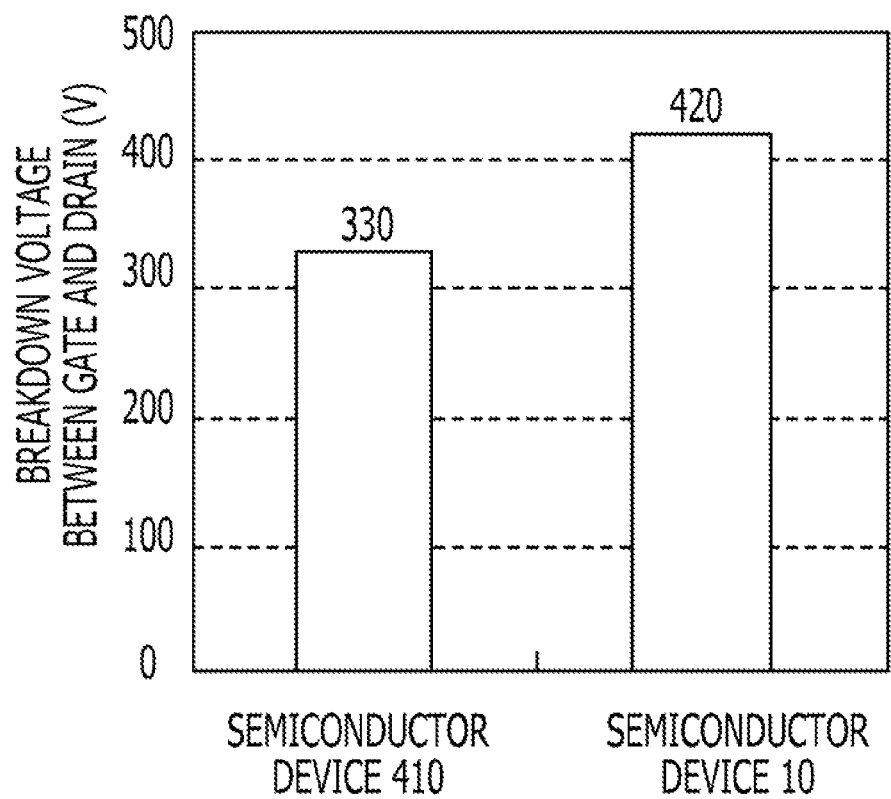
FIG. 7 is a explanatory diagram of a breakdown voltage in a semiconductor device.

FIG. 7 shows breakdown voltages between gate and drain of the semiconductor device 410 shown in FIG. 1 and the semiconductor device 10 according to the present embodiment shown in FIG. 2. The breakdown voltage of the semiconductor device 410, in which the bottom of the gate recess 422 is flat, shown in FIG. 1 is 330 V, whereas the breakdown voltage of the semiconductor device 10, in which the bottom of the gate recess 22 is formed into the convex shape, shown in FIG. 2 is 420 V. As described above, regarding the semiconductor device according to the present embodiment, it is possible to improve the breakdown voltage by forming the bottom of the gate recess into the convex shape.

As for another method for forming the bottom of the gate recess into the convex shape, the bottom of the gate recess is dry-etched into a flat shape and, thereafter, the resist is removed by an organic solvent or the like. Subsequently, a resist pattern is formed in such a way that both end portions of the recess bottom are exposed, and dry etching is performed, so that the recess bottom may be formed into the convex shape. As for another method, a resist pattern for forming a gate recess is patterned into a convex shape in the recess, dry etching is performed and, thereafter, the resist is removed by an organic solvent or the like. In this manner, the recess bottom may be formed into a convex shape.

Next, a second embodiment will be described.

Figure 8:
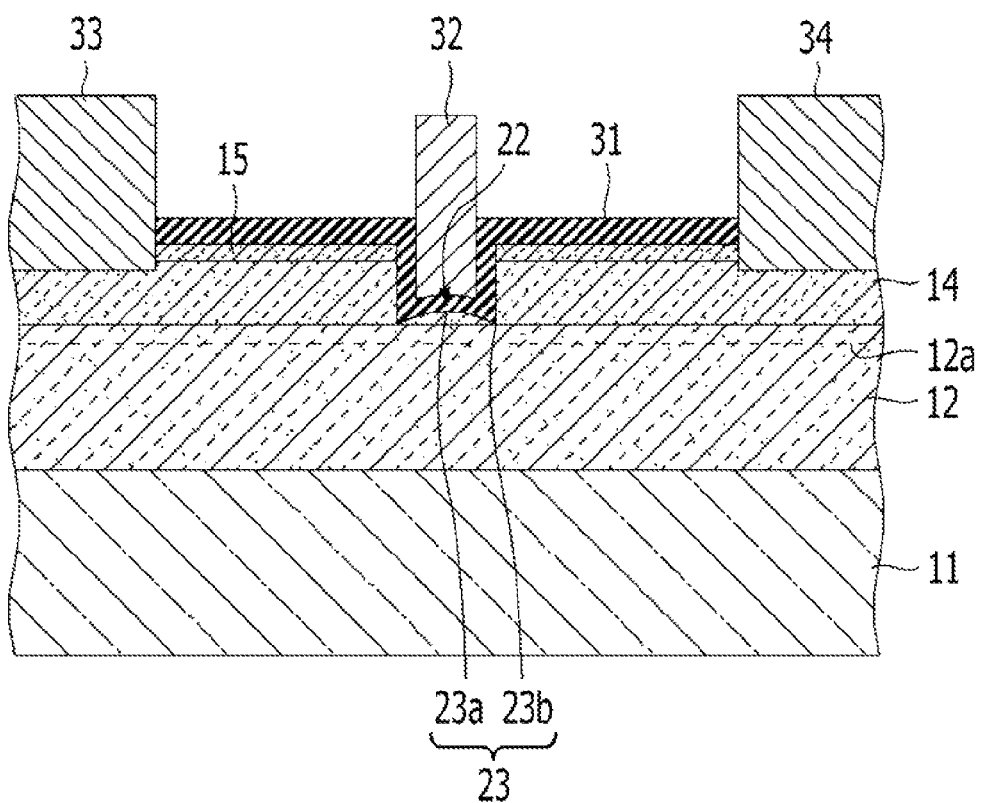
FIG. 8 is a structural diagram of a semiconductor device according to a second embodiment.

A semiconductor device according to the present embodiment will be described with reference to FIG. 8. The semiconductor device 110 according to the present embodiment includes a semiconductor layer composed of an electron transit layer 12, an electron supply layer 14, and a cap layer 15, which are formed by epitaxial growth, on a substrate 11 formed from semi-insulating film SiC or the like. In this regard, the electron transit layer 12 serving as a first semiconductor layer is formed from i-GaN, the electron supply layer 14 serving as a second semiconductor layer is formed from n-AlGaN, and the cap layer 15 serving as a third semiconductor layer is formed from n-GaN.

Consequently, a 2DEG 12a is formed in the electron transit layer 12 in the vicinity of the interface between the electron transit layer 12 and the electron supply layer 14. The gate recess 22 is formed by etching a part of the cap layer 15 and the electron supply layer 14, and the bottom 23 of the gate recess 22 is formed into a convex shape. That is, the central portion 23a is formed to become higher than the peripheral portion 23b. The method for forming the bottom 23 of the gate recess 22 into the convex shape, as described above, will be described later. Moreover, an insulating film 31 serving as a gate insulating film is disposed on the bottom 23 and the side surface of the gate recess 22 and the cap layer 15. A gate electrode 32 is disposed on the region provided with the gate recess 22 with the insulating film 31 therebetween. Furthermore, a source electrode 33 and a drain electrode 34 are disposed on the electron supply layer 14. In this regard, the source electrode 33 and the drain electrode 34 may be disposed on the electron transit layer 12.

Next, the method for manufacturing the semiconductor device 110 according to the present embodiment will be described with reference to FIG. 9A to FIG. 9J.

Figure 9A:
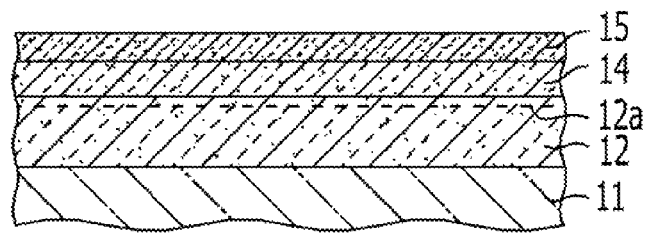
FIGS. 9A to 9J are diagrams of a method for manufacturing the semiconductor device according to the second embodiment.

Initially, as shown in FIG. 9A, the electron transit layer 12, the electron supply layer 14, and the cap layer 15 are formed sequentially on the substrate 11 formed from semi-insulating SiC or the like by epitaxial growth by MOVPE, so as to form the semiconductor layer. As for the substrate 11, sapphire, GaN, and the like may be used besides SiC. The electron transit layer 12 serving as the first semiconductor layer is formed from i-GaN in such a way that the thickness becomes about 3 µm. The electron supply layer 14 serving as the second semiconductor layer is formed from n-AlGaN in such a way that the thickness becomes about 30 nm and is doped with $5 \times 10^{18}$ cm$^{-3}$ of Si as an impurity element. The cap layer 15 serving as the third semiconductor layer is formed from n-GaN in such a way that the thickness becomes about 10 nm and is doped with $5 \times 10^{18}$ cm$^{-3}$ of Si as an impurity element. Consequently, the 2DEG 12a is formed in the electron transit layer 12 in the vicinity of the interface between the electron transit layer 12 and the electron supply layer 14. Subsequently, dry etching by using a gas including a chlorine component is performed, and an insulating film is formed or ion implantation of a predetermined ion is performed in the region subjected to the dry etching, so that the element isolation region is formed.

Figure 9B:
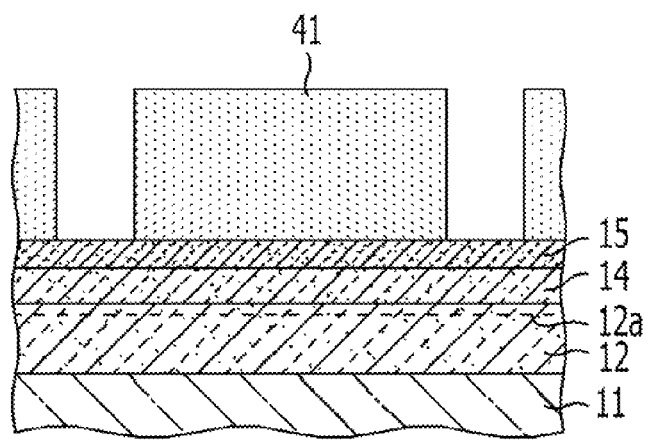

Then, as shown in FIG. 9B, a resist pattern 41 is formed. Specifically, a photoresist is applied to the surface of the cap layer 15, and exposure with an exposing apparatus and development are performed, so that a resist pattern 41 having opening portions in the regions to be provided with the source electrode 33 and the drain electrode 34 is formed.

Figure 9C:
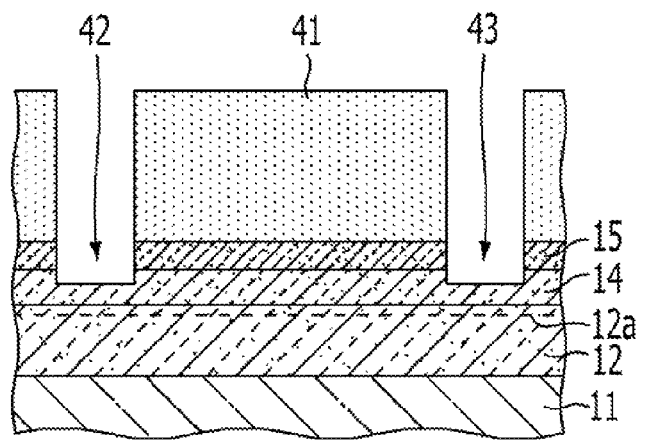

As shown in FIG. 9C, a part of the cap layer 15 and the electron supply layer 14 in the region not provided with the resist pattern 41 are removed by dry etching, e.g., RIE, so as to form opening regions 42 and 43. This dry etching, e.g., RIE, is performed by introducing a gas, which includes a chlorine component, as an etching gas into a chamber.

Figure 9D:
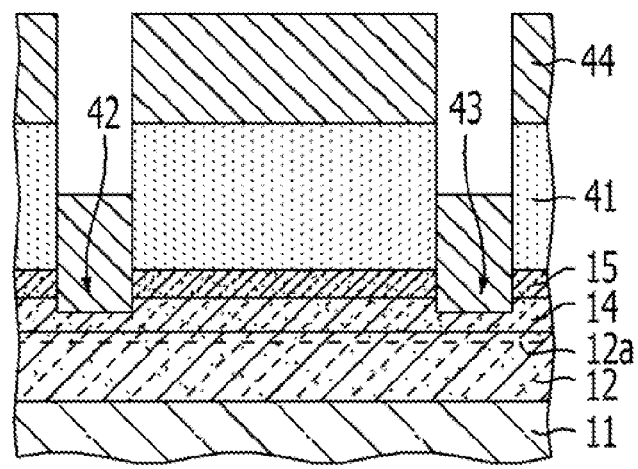

As shown in FIG. 9D, a Ta film having a thickness of about 20 nm and an Al film having a thickness of about 200 nm are formed sequentially through vacuum evaporation, so that a metal film 44 is formed.

Figure 9E:
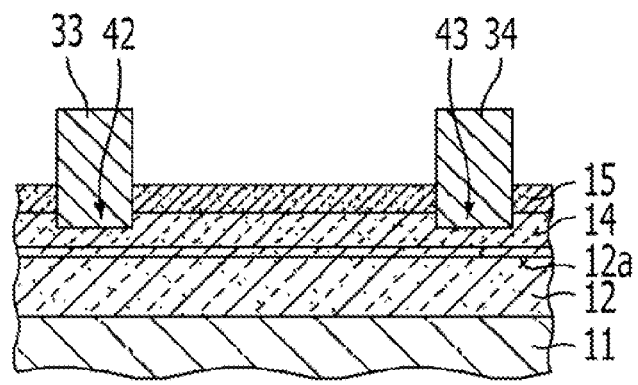

As shown in FIG. 9E, lift-off is performed by using an organic solvent or the like and, thereby, the metal film 44 formed on the resist pattern 41 is removed together with the resist pattern 41. Consequently, the source electrode 33 and the drain electrode 34 are formed by the metal film 44 formed in the regions not provided with the resist pattern 41, that is, opening regions 42 and 43. Thereafter, the source electrode 33 and the drain electrode 34 are brought into ohmic contact by performing a heat treatment at a temperature of 400° C. to 1,000° C., for example, 550° C.

Figure 9F:
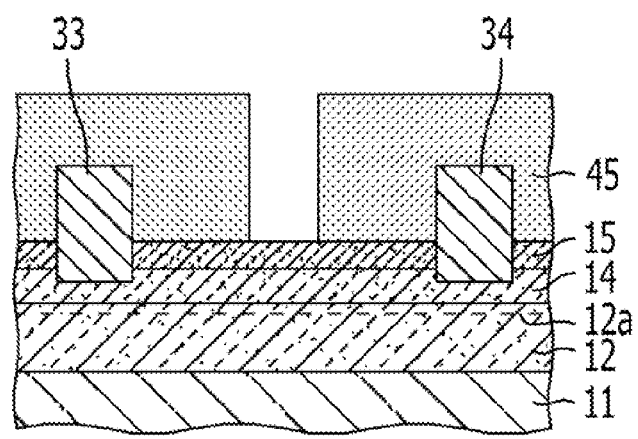

As shown in FIG. 9F, a resist pattern 45 is formed on the surfaces of the source electrode 33, the drain electrode 34, and the cap layer 15. The resist pattern 45 is formed by applying a photoresist to the surfaces of the cap layer 15 and the like and performing exposure with an exposing apparatus and development. In this manner, the resist pattern 45 having an opening portion in the region to be provided with the gate recess 22, as described later, is formed.

Figure 9G:
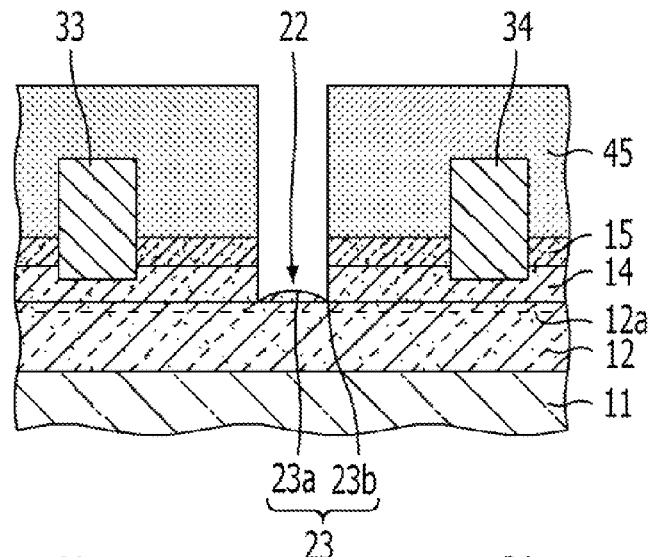

As shown in FIG. 9G, dry etching, e.g., RIE, is performed and, thereby, a part of or all the cap layer 15 and the electron supply layer 14 in the region not provided with the resist pattern 45 are removed, so as to form the gate recess 22. As for the etching gas used for this dry etching, e.g., RIE, a gas including a chlorine component is employed. In the present embodiment, 30 sccm of Cl$_2$ serving as an etching gas is introduced into an etching chamber, the pressure in the etching chamber is specified to be 2 Pa, 20 W of RF power is applied and, thereby, RIE is performed, so as to form the gate recess 22. Consequently, the bottom 23 of the gate recess 22 may be formed into a convex shape. That is, the bottom 23 may be formed in such a way that the central portion 23a is higher than the peripheral portion 23b. In order to form the bottom 23 of the gate recess 22 into a convex shape, as described above, a condition in which the substrate temperature is relatively low, specifically a condition in which the substrate temperature is specified to be ambient temperature or lower by, for example, cooling the substrate, and a condition in which the applied bias is relatively high are preferable. The condition in which the applied bias is high refers to, for example, the condition in which the applied RF power is high. This is because a high RF power causes a high self bias.

Figure 9H:
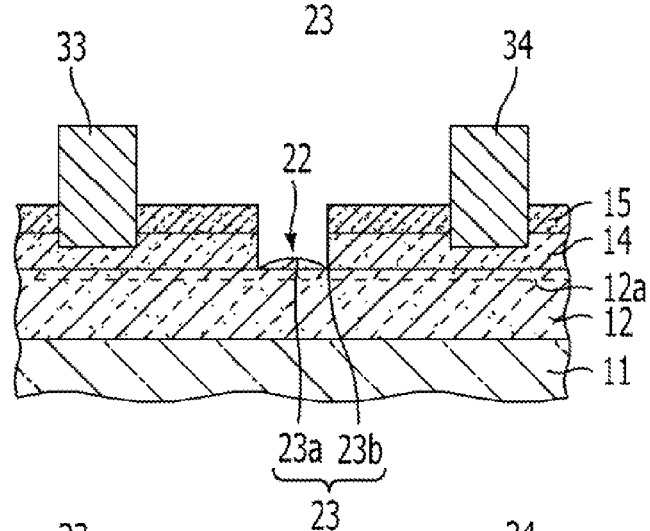

As shown in FIG. 9H, the resist pattern 45 is removed by an organic solvent or the like. Consequently, the resist pattern 45 is removed and, thereby, the gate recess 22 is formed.

Figure 9I:
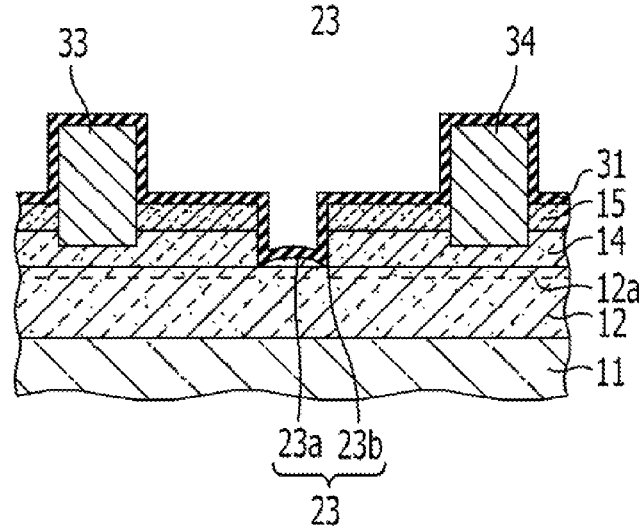

As shown in FIG. 9I, the insulating film 31 is formed on the surface of the cap layer 15 and the gate recess 22. In the present embodiment, as for the insulating film 31, an aluminum oxide film having a thickness of 2 nm to 200 nm is formed. Specifically, an aluminum oxide film having a thickness of about 10 nm is formed and, thereby, the insulating film 31 is formed. Examples of methods for forming the insulating film 31 include CVD, ALD, and sputtering.

Figure 9J:
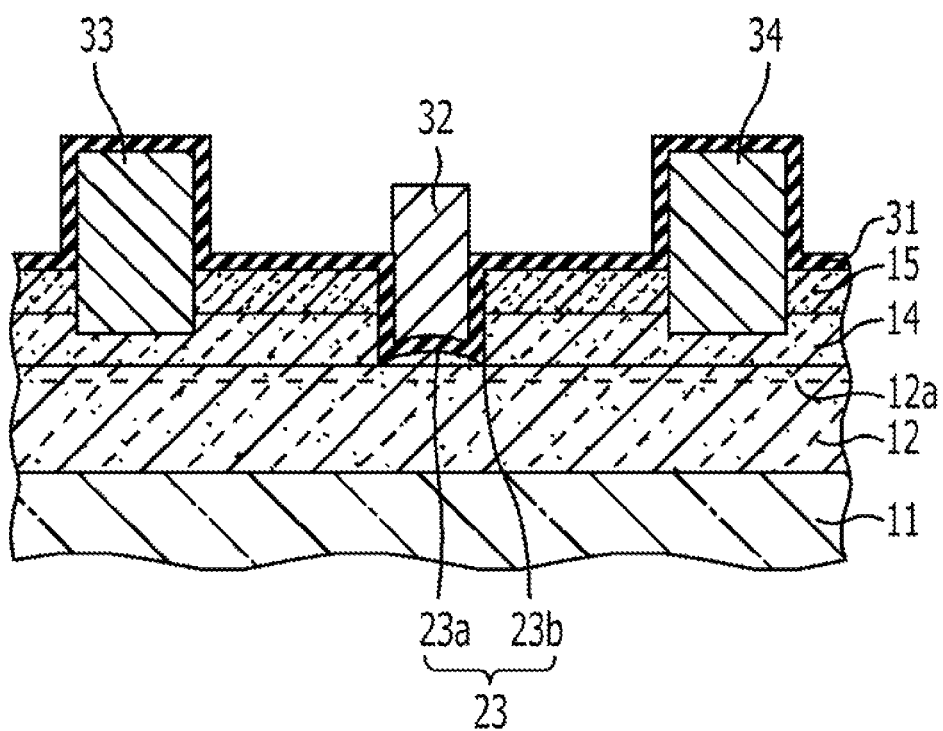

As shown in FIG. 9J, the gate electrode 32 is formed on the region provided with the gate recess 22 with the insulating film 31 therebetween. Specifically, a photoresist is applied to the insulating film 31, and exposure with an exposing apparatus and development are performed, so that a resist pattern, although not shown in the drawing, having an opening portion in the region to be provided with the gate electrode 32 is formed. Thereafter, a Ni film having a thickness of about 30 nm and a Au film having a thickness of about 400 nm are formed sequentially through vacuum evaporation, so that a metal film is formed. Subsequently, lift-off is performed by using an organic solvent or the like and, thereby, the metal film disposed on the resist pattern is removed together with the resist pattern. Consequently, the gate electrode 32 is formed by the metal film formed in the region not provided with the resist pattern.

In this manner, a semiconductor device may be produced on the basis of the method for manufacturing a semiconductor device according to the present embodiment. The details other than those described above are substantially the same as the first embodiment.

Next, a third embodiment will be described.

Figure 10:
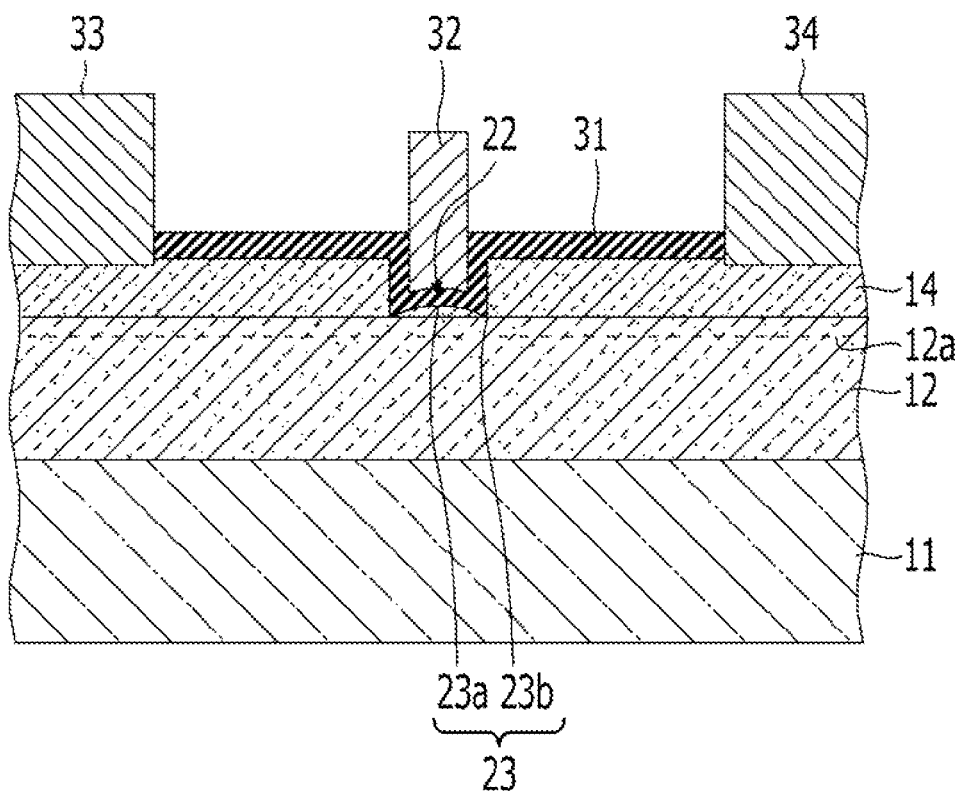
FIG. 10 is a structural diagram of a semiconductor device according to a third embodiment.

A semiconductor device according to the present embodiment will be described with reference to FIG. 10. The semiconductor device 210 according to the present embodiment includes a semiconductor layer composed of an electron transit layer 12 and an electron supply layer 14, which are formed by epitaxial growth, on a substrate 11 formed from semi-insulating film SiC or the like. In this regard, the electron transit layer 12 serving as a first semiconductor layer is formed from i-GaN and the electron supply layer 14 serving as a second semiconductor layer is formed from n-AlGaN.

Consequently, a 2DEG 12a is formed in the electron transit layer 12 in the vicinity of the interface between the electron transit layer 12 and the electron supply layer 14. The gate recess 22 is formed by etching a part of the electron supply layer 14, and the bottom 23 of the gate recess 22 is formed into a convex shape. That is, the central portion 23a is formed to become higher than the peripheral portion 23b. The method for forming the bottom 23 of the gate recess 22 into the convex shape, as described above, will be described later. Moreover, an insulating film 31 serving as a gate insulating film is disposed on the bottom 23 and the side surface of the gate recess 22 and the electron supply layer 14. A gate electrode 32 is disposed on the region provided with the gate recess 22 with the insulating film 31 therebetween. Furthermore, a source electrode 33 and a drain electrode 34 are disposed on the electron supply layer 14. In this regard, the source electrode 33 and the drain electrode 34 may be disposed on the electron transit layer 12.

Next, the method for manufacturing the semiconductor device 210 according to the present embodiment will be described with reference to FIG. 11A to FIG. 11I.

Figure 11A:
FIGS. 11A to 11I are diagrams of a method for manufacturing the semiconductor device according to the third embodiment.

Initially, as shown in FIG. 11A, the electron transit layer 12 and the electron supply layer 14 are formed sequentially on the substrate 11 formed from semi-insulating SiC or the like by epitaxial growth by MOVPE, so as to form the semiconductor layer. As for the substrate 11, sapphire, GaN, and the like may be used besides SiC. The electron transit layer 12 serving as the first semiconductor layer is formed from i-GaN in such a way that the thickness becomes about 3 μm. The electron supply layer 14 serving as the second semiconductor layer is formed from n-AlGaN in such a way that the thickness becomes about 30 nm and is doped with $5\times10^{18}$ cm$^{-3}$ of Si as an impurity element. Consequently, the 2DEG 12a is formed in the electron transit layer 12 in the vicinity of the interface between the electron transit layer 12 and the electron supply layer 14. Subsequently, dry etching by using a gas including a chlorine component is performed, and an insulating film is formed or ion implantation of a predetermined ion is performed in the region subjected to the dry etching, so that the element isolation region is formed.

Figure 11B:
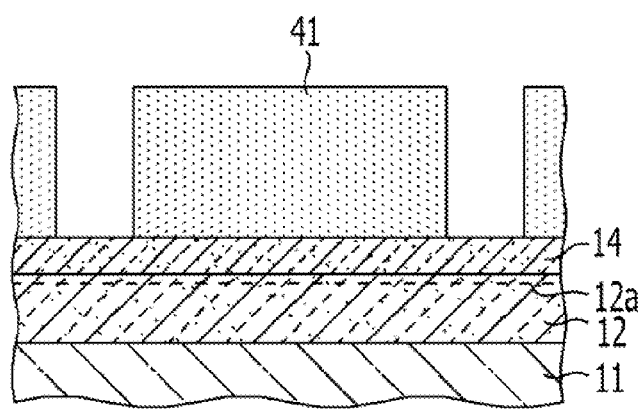

Then, as shown in FIG. 11B, a resist pattern 41 is formed. Specifically, a photoresist is applied to the surface of the electron supply layer 14, and exposure with an exposing apparatus and development are performed, so that a resist pattern 41 having opening portions in the regions to be provided with the source electrode 33 and the drain electrode 34 is formed.

Figure 11C:
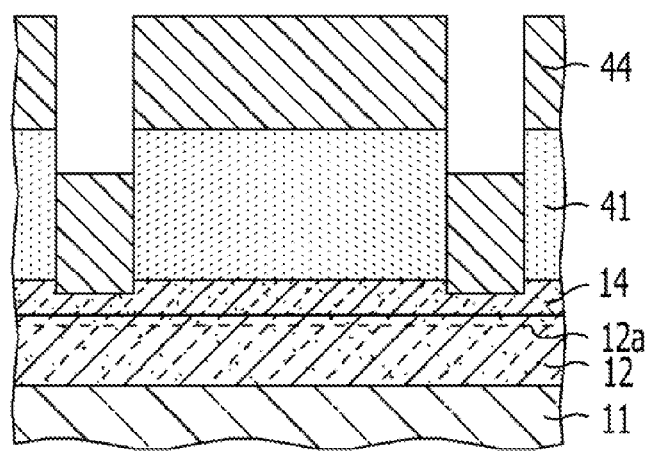

As shown in FIG. 11C, a part of the electron supply layer 14 is removed by dry etching, e.g., RIE, as desired or necessary. Subsequently, a Ta film having a thickness of about 20 nm and an Al film having a thickness of about 200 nm are formed sequentially through vacuum evaporation, so that a metal film 44 is formed.

Figure 11D:
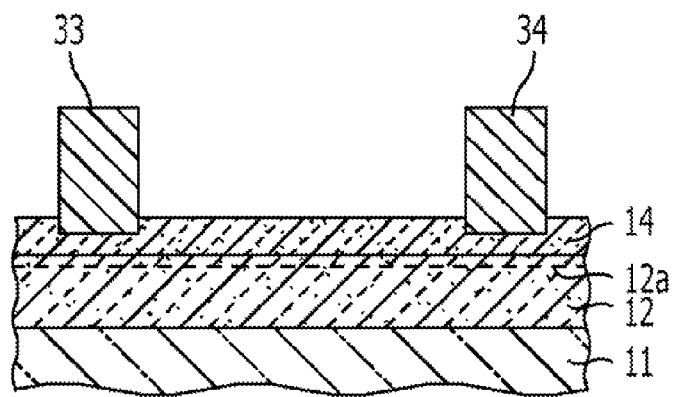

As shown in FIG. 11D, lift-off is performed by using an organic solvent or the like and, thereby, the metal film 44 formed on the resist pattern 41 is removed together with the resist pattern 41. Consequently, the source electrode 33 and the drain electrode 34 are formed by the metal film 44 formed in the regions not provided with the resist pattern 41. Thereafter, the source electrode 33 and the drain electrode 34 are brought into ohmic contact by performing a heat treatment at a temperature of 400° C. to 1,000° C., for example, 550° C.

Figure 11E:
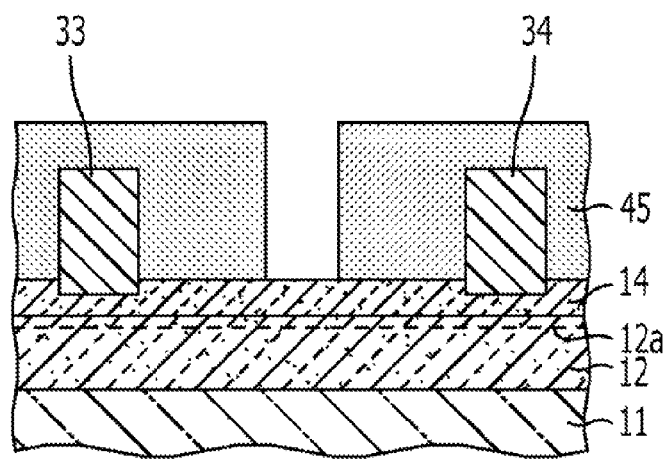

As shown in FIG. 11E, a resist pattern 45 is formed on the surfaces of the source electrode 33, the drain electrode 34, and the electron supply layer 14. The resist pattern 45 is formed by applying a photoresist to the surfaces of the electron supply layer 14 and the like and performing exposure with an exposing apparatus and development. In this manner, the resist pattern 45 having an opening portion in the region to be provided with the gate recess 22, as described later, is formed.

Figure 11F:
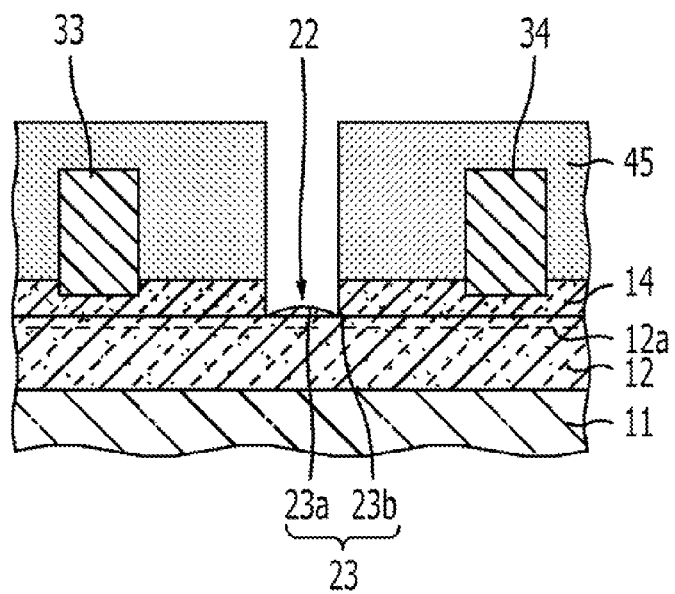

As shown in FIG. 11F, dry etching, e.g., RIE, is performed and, thereby, a part of or all the electron supply layer 14 in the region not provided with the resist pattern 45 is removed, so as to form the gate recess 22. As for the etching gas used for this dry etching, e.g., RIE, a gas including a chlorine component is employed. In the present embodiment, 30 sccm of $Cl_2$ serving as an etching gas is introduced into an etching chamber, the pressure in the etching chamber is specified to be 2 Pa, 20 W of RF power is applied and, thereby, RIE is performed, so as to form the gate recess 22. Consequently, the bottom 23 of the gate recess 22 may be formed into a convex shape. That is, the bottom 23 may be formed in such a way that the central portion 23a is higher than the peripheral portion 23b. In order to form the bottom 23 of the gate recess 22 into a convex shape, as described above, a condition in which the substrate temperature is relatively low, specifically a condition in which the substrate temperature is specified to be ambient temperature or lower by, for example, cooling the substrate, and a condition in which the applied bias is relatively high are preferable. The condition in which the applied bias is high refers to, for example, the condition in which the applied RF power is high. This is because a high RF power causes a high self bias.

Figure 11G:
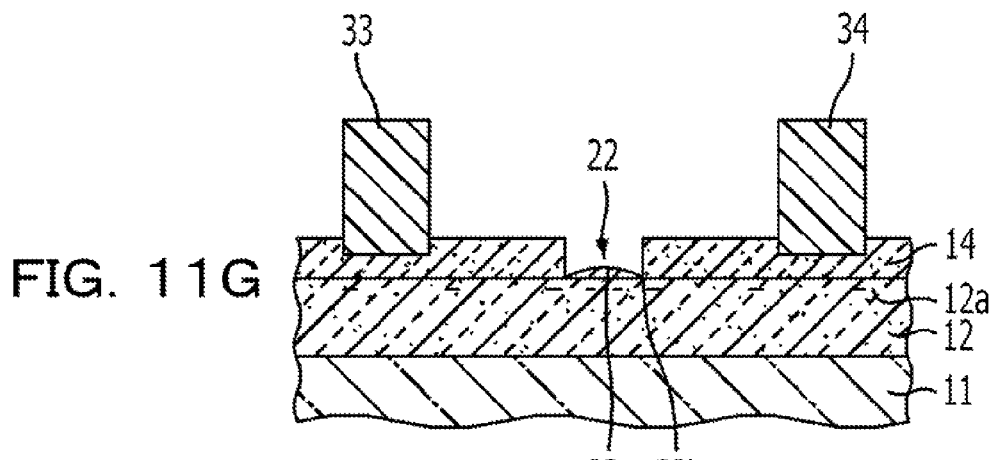

As shown in FIG. 11G, the resist pattern 45 is removed by an organic solvent or the like. Consequently, the resist pattern 45 is removed and, thereby, the gate recess 22 is formed.

Figure 11H:
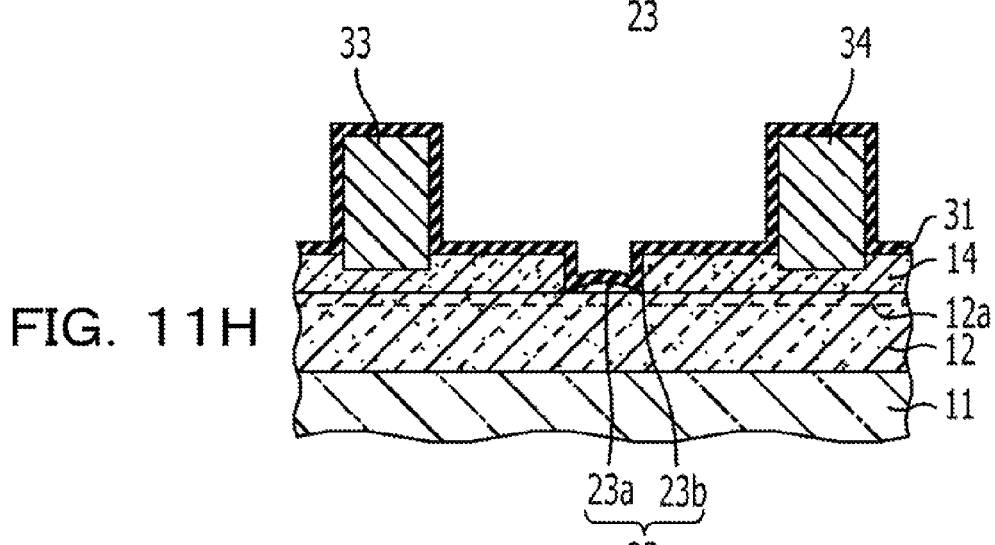

As shown in FIG. 11H, the insulating film 31 is formed on the surface of the electron supply layer 14 and the gate recess 22. In the present embodiment, as for the insulating film 31, an aluminum oxide film having a thickness of 2 nm to 200 nm is formed. Specifically, an aluminum oxide film having a thickness of about 10 nm is formed and, thereby, the insulating film 31 is formed. Examples of methods for forming the insulating film 31 include CVD, ALD, and sputtering.

Figure 11I:
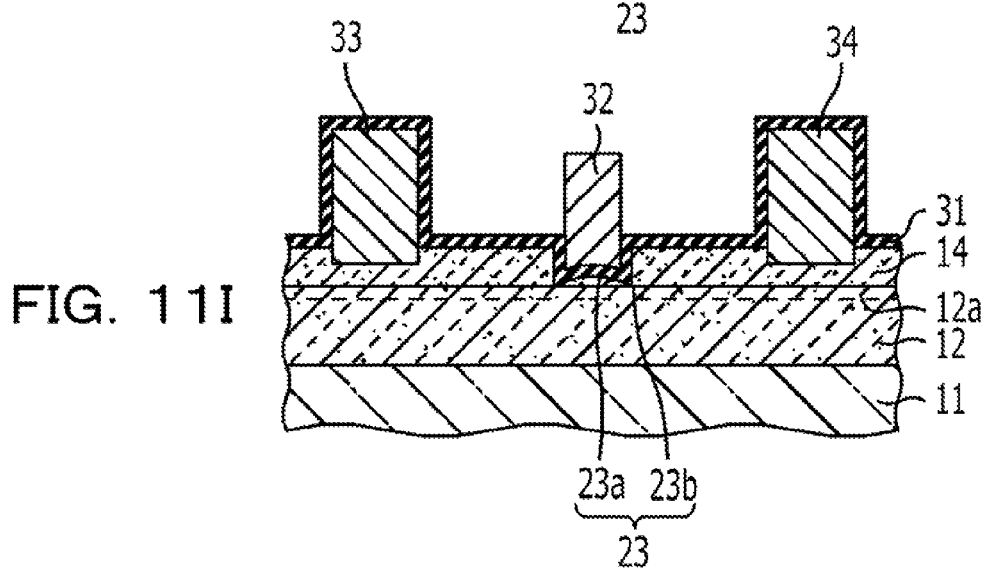

As shown in FIG. 11I, the gate electrode 32 is formed on the region provided with the gate recess 22 with the insulating film 31 therebetween. Specifically, a photoresist is applied to the insulating film 31, and exposure with an exposing apparatus and development are performed, so that a resist pattern, although not shown in the drawing, having an opening portion in the region to be provided with the gate electrode 32 is formed. Thereafter, a Ni film having a thickness of about 30 nm and a Au film having a thickness of about 400 nm are formed sequentially through vacuum evaporation, so that a metal film is formed. Subsequently, lift-off is performed by using an organic solvent or the like and, thereby, the metal film disposed on the resist pattern is removed together with the resist pattern. Consequently, the gate electrode 32 is formed by the metal film formed in the region not provided with the resist pattern.

In this manner, a semiconductor device may be produced on the basis of the method for manufacturing a semiconductor device according to the present embodiment. The details other than those described above are the same as the first embodiment.

Figure 12:
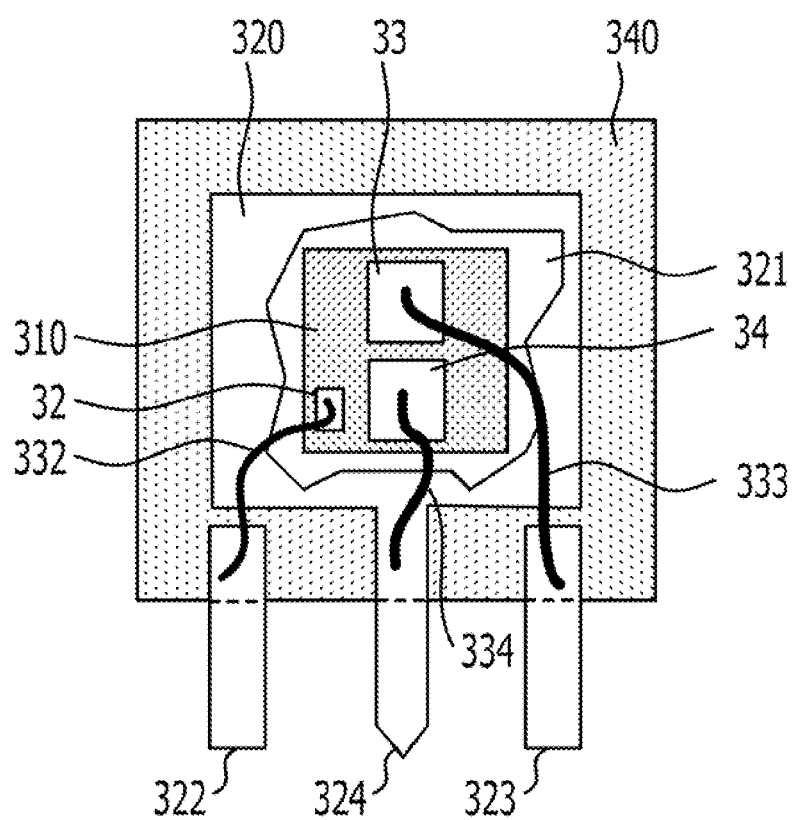
FIG. 12 is an explanatory diagram of a discrete-packaged semiconductor device according to a fourth embodiment.

Next, a fourth embodiment will be described. In the present embodiment, the semiconductor device according to any one of the first to the third embodiments is discrete-packaged. Such a discrete-packaged semiconductor device will be described with reference to FIG. 12. In this regard, FIG. 12 schematically shows the inside of the discrete-packaged semiconductor device, and the arrangement of the electrodes and the like are different from those shown in the first to the third embodiments.

Initially, the semiconductor device produced in any one of the first to the third embodiments is cut by dicing or the like to form a semiconductor chip 310 of HEMT of a GaN based semiconductor material. This semiconductor chip 310 is fixed to a lead frame 320 with a die-attach agent 321, e.g., solder.

Thereafter, a gate electrode 32 is connected to a gate lead 322 with a bonding wire 332, a source electrode 33 is connected to a source lead 323 with a bonding wire 333, and a drain electrode 34 is connected to a drain lead 324 with a bonding wire 334. In this regard, the bonding wires 332, 333, and 334 are formed by a metal material, e.g., Al.

Subsequently, resin-sealing with a mold resin 340 is performed by a transfer mold method. In this manner, a discrete-packaged semiconductor device of HEMT by using a GaN based material may be produced.

Figure 13:
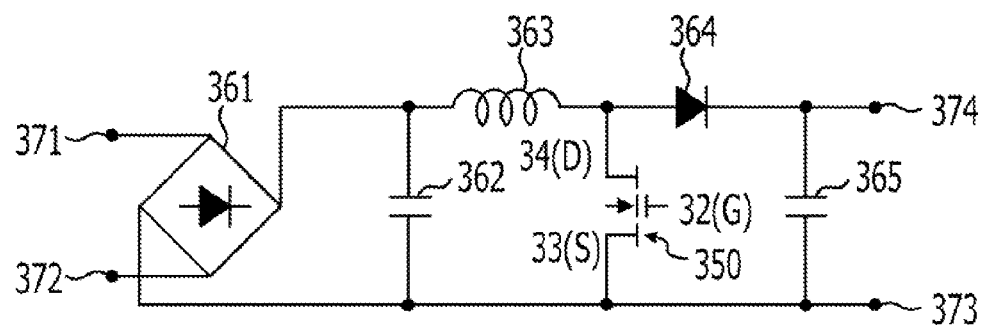
FIG. 13 is a circuit diagram of a PFC circuit according to the fourth embodiment.

Then, a power factor correction (PFC) circuit by using a GaN based semiconductor material HEMT 350, which is a semiconductor device produced in any one of the first to the third embodiments, will be described with reference to FIG. 13. This PFC circuit is formed on a circuit board, although not shown in the drawing, and includes a diode bridge 361, a first capacitor 362, a choke coil 363, a diode 364, and a second capacitor 365 besides HEMT 350. The input side of the diode bridge 361 is connected to an alternating current (AC) power supply through input terminals 371 and 372. One terminal in the output side of the diode bridge 361 is connected to one terminal of the first capacitor 362, a source electrode 33 (S) of HEMT 350, one terminal of the second capacitor 365, and an output terminal 373. Furthermore, the other terminal in the output side of the diode bridge 361 is connected to the other terminal of the first capacitor 362 and one terminal of the choke coil 363. The other terminal of the choke coil 363 is connected to a drain electrode 34 (D) of HEMT 350, and the anode terminal of the diode 364. The cathode terminal of the diode 364 is connected to the other terminal of the second capacitor 365 and an output terminal 374. The gate electrode 32 (G) of HEMT 350 is connected to a gate driver, although not shown in the drawing. Consequently, this PFC circuit may obtain a direct current (DC) electric power through the output terminals 373 and 374. Such a PFC circuit is used while being incorporated into a server electric supply or the like, so that harmonic components may be removed, and the power factor may be increased.

In the present embodiment, the semiconductor devices, which have uniform characteristics and which exhibit high yields, according to the first to the third embodiments are used and, therefore, the electric power may be supplied stably at a low cost with high reliability.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device comprising:
a first semiconductor layer disposed over and above a substrate;
a second semiconductor layer disposed over and above the first semiconductor layer;
a gate recess disposed, through removal of a part of or all the second semiconductor layer, in a predetermined region over and above the first semiconductor layer;
an insulating film disposed over the gate recess and the second semiconductor layer;
a gate electrode disposed over the gate recess with the insulating film therebetween; and
a source electrode and a drain electrode disposed over and above the first semiconductor layer or the second semiconductor layer,
whereby a central portion of the gate recess is higher than peripheral portions of the gate recess along each sidewall of the gate recess, and
a bottom of the gate recess is below a bottom surface of each of the source electrode and the drain electrode,
wherein in the bottom of the gate recess, the insulating film directly contacts the first semiconductor layer at the peripheral portions.

2. A semiconductor device comprising:
a first semiconductor layer disposed over a substrate;
a second semiconductor layer disposed over the first semiconductor layer;
a third semiconductor layer disposed over the second semiconductor layer;
a gate recess disposed, through removal of all the third semiconductor layer and a part of or all the second semiconductor layer, in a predetermined region over the first semiconductor layer;
an insulating film disposed over the gate recess and the third semiconductor layer;
a gate electrode disposed over the gate recess with the insulating film therebetween; and
a source electrode and a drain electrode disposed over the first semiconductor layer or the second semiconductor layer,
whereby a central portion of the gate recess is higher than peripheral portions of the gate recess along each sidewall of the gate recess, and
a bottom of the gate recess is below a bottom surface of each of the source electrode and the drain electrode, wherein in the bottom of the gate recess, the insulating film directly contacts the first semiconductor layer at the peripheral portions.

3. The semiconductor device according to claim 2, wherein the third semiconductor layer comprises n-GaN.

4. The semiconductor device according to claim 1, wherein the first semiconductor layer and the second semiconductor layer are formed from a nitride semiconductor.

5. The semiconductor device according to claim 1, wherein the first semiconductor layer comprises i-GaN.

6. The semiconductor device according to claim 1, wherein the second semiconductor layer comprises any one of AlGaN or InAlN.

7. A semiconductor device comprising:
a first semiconductor layer disposed over and above a substrate;
a second semiconductor layer disposed over and above the first semiconductor layer;
a gate recess disposed, through removal of a part of or all the second semiconductor layer, in a predetermined region over and above the first semiconductor layer;
an insulating film disposed over the gate recess and the second semiconductor layer;
a gate electrode disposed over the gate recess with the insulating film therebetween; and
a source electrode and a drain electrode disposed over and above the first semiconductor layer or the second semiconductor layer,
whereby a central portion of the gate recess is higher than peripheral portions of the gate recess along each sidewall of the gate recess, and
a bottom of the gate recess is below a bottom surface of each of the source electrode and the drain electrode,
wherein a third semiconductor layer is disposed between the first semiconductor layer and the second semiconductor layer,
wherein in the bottom of the gate recess, the insulating film directly contacts the third semiconductor layer at any one of the central portion, the peripheral portions, and both the central portion and the peripheral portions.

8. The semiconductor device according to claim 7, wherein both the second semiconductor layer and the third semiconductor layer comprise AlGaN, and the composition ratio of Al in the third semiconductor layer is lower than that in the second semiconductor layer.

9. The semiconductor device according to claim 1, wherein the insulating film is formed from at least one material selected from the group consisting of oxides, nitrides, and oxynitrides of Si, Al, Hf, Zr, Ti, Ta, and W.

10. The semiconductor device according to claim 1, wherein the semiconductor device is HEMT.

11. A semiconductor device comprising:
a first semiconductor layer disposed over a substrate;
a second semiconductor layer disposed over the first semiconductor layer;
a third semiconductor layer disposed over the second semiconductor layer;
a gate recess disposed, through removal of all the third semiconductor layer and a part of or all the second semiconductor layer, in a predetermined region over the first semiconductor layer;
an insulating film disposed over the gate recess;
a gate electrode disposed over the gate recess with the insulating film therebetween; and
a source electrode and a drain electrode disposed over the first semiconductor layer or the second semiconductor layer,
whereby a central portion of the gate recess is higher than peripheral portions of the gate recess along each sidewall of the gate recess, and
a bottom of the gate recess is below a bottom surface of each of the source electrode and the drain electrode,
wherein a fourth semiconductor layer is disposed between the first semiconductor layer and the second semiconductor layer,
wherein in the bottom of the gate recess, the insulating film directly contacts the fourth semiconductor layer at any one of the central portion, the peripheral portions, and both the central portion and the peripheral portions.

* * * * *